United States Patent
Caskey et al.

(10) Patent No.: US 9,876,002 B2
(45) Date of Patent: Jan. 23, 2018

(54) MICROELECTRONIC PACKAGE WITH STACKED MICROELECTRONIC UNITS AND METHOD FOR MANUFACTURE THEREOF

(71) Applicant: Invensas Corporation, San Jose, CA (US)

(72) Inventors: Terrence Caskey, Santa Cruz, CA (US); Ilyas Mohammed, Santa Clara, CA (US)

(73) Assignee: Invensas Corporation, San Jose, CA (US)

( * ) Notice: Subject to any disclaimer, the term of this patent is extended or adjusted under 35 U.S.C. 154(b) by 0 days.

(21) Appl. No.: 15/419,237

(22) Filed: Jan. 30, 2017

(65) Prior Publication Data

US 2017/0141094 A1    May 18, 2017

Related U.S. Application Data

(60) Continuation of application No. 14/883,977, filed on Oct. 15, 2015, now Pat. No. 9,583,475, which is a
(Continued)

(51) Int. Cl.
*H01L 25/00* (2006.01)
*H01L 25/18* (2006.01)
(Continued)

(52) U.S. Cl.
CPC ............ *H01L 25/18* (2013.01); *H01L 21/565* (2013.01); *H01L 21/568* (2013.01);
(Continued)

(58) Field of Classification Search
CPC ......... H01L 25/00; H01L 25/11; H01L 23/00; H01L 23/31; H01L 23/13; H01L 23/3114;
(Continued)

(56) References Cited

U.S. PATENT DOCUMENTS

| 5,422,435 A | 6/1995 | Takiar et al. |
| 5,495,398 A | 2/1996 | Takiar et al. |

(Continued)

FOREIGN PATENT DOCUMENTS

| DE | 10023823 | 12/2001 |
| JP | 11-135713 | 5/1999 |

(Continued)

OTHER PUBLICATIONS

International Search Report and Written Opinion, PCT/US2012/060585, dated Jan. 28, 2013.

*Primary Examiner* — Chuong A Luu
(74) *Attorney, Agent, or Firm* — Lerner, David, Littenberg, Krumholz & Mentlik, LLP

(57) ABSTRACT

A microelectronic package may include a first microelectronic unit including a semiconductor chip having first chip contacts, an encapsulant contacting an edge of the semiconductor chip, and first unit contacts exposed at a surface of the encapsulant and electrically connected with the first chip contacts. The package may include a second microelectronic unit including a semiconductor chip having second chip contacts at a surface thereof, and an encapsulant contacting an edge of the chip of the second unit and having a surface extending away from the edge. The surfaces of the chip and the encapsulant of the second unit define a face of the second unit. Package terminals at the face may be electrically connected with the first unit contacts through bond wires electrically connected with the first unit contacts, and the second chip contacts through metallized vias and traces formed in contact with the second chip contacts.

20 Claims, 7 Drawing Sheets

Related U.S. Application Data continuation of application No. 14/243,994, filed on Apr. 3, 2014, now Pat. No. 9,165,911, which is a division of application No. 13/277,330, filed on Oct. 20, 2011, now Pat. No. 8,723,327.

(51) Int. Cl.

| | | |
|---|---|---|
| *H01L 25/065* | (2006.01) | |
| *H01L 25/10* | (2006.01) | |
| *H01L 23/13* | (2006.01) | |
| *H01L 23/538* | (2006.01) | |
| *H01L 25/11* | (2006.01) | |
| *H01L 21/56* | (2006.01) | |
| *H01L 21/683* | (2006.01) | |
| H01L 23/31 | (2006.01) | |
| H01L 23/00 | (2006.01) | |
| H01L 23/498 | (2006.01) | |
| H01L 21/768 | (2006.01) | |

(52) U.S. Cl.
CPC .......... *H01L 21/6835* (2013.01); *H01L 23/13* (2013.01); *H01L 23/3114* (2013.01); *H01L 23/3185* (2013.01); *H01L 23/5389* (2013.01); *H01L 24/06* (2013.01); *H01L 24/19* (2013.01); *H01L 24/20* (2013.01); *H01L 24/43* (2013.01); *H01L 24/49* (2013.01); *H01L 24/73* (2013.01); *H01L 24/96* (2013.01); *H01L 25/0657* (2013.01); *H01L 25/105* (2013.01); *H01L 25/117* (2013.01); *H01L 25/50* (2013.01); H01L 21/76802 (2013.01); H01L 21/76877 (2013.01); H01L 23/3107 (2013.01); H01L 23/49816 (2013.01); H01L 24/05 (2013.01); H01L 24/13 (2013.01); H01L 24/16 (2013.01); H01L 24/29 (2013.01); H01L 24/32 (2013.01); H01L 24/45 (2013.01); H01L 2224/0401 (2013.01); H01L 2224/04042 (2013.01); H01L 2224/04105 (2013.01); H01L 2224/05124 (2013.01); H01L 2224/05147 (2013.01); H01L 2224/05548 (2013.01); H01L 2224/05554 (2013.01); H01L 2224/05571 (2013.01); H01L 2224/05624 (2013.01); H01L 2224/05647 (2013.01); H01L 2224/06155 (2013.01); H01L 2224/131 (2013.01); H01L 2224/133 (2013.01); H01L 2224/13023 (2013.01); H01L 2224/1329 (2013.01); H01L 2224/13109 (2013.01); H01L 2224/13111 (2013.01); H01L 2224/13144 (2013.01); H01L 2224/14131 (2013.01); H01L 2224/27334 (2013.01); H01L 2224/2919 (2013.01); H01L 2224/32145 (2013.01); H01L 2224/32225 (2013.01); H01L 2224/45124 (2013.01); H01L 2224/45144 (2013.01); H01L 2224/45147 (2013.01); H01L 2224/4824 (2013.01); H01L 2224/48091 (2013.01); H01L 2224/48108 (2013.01); H01L 2224/48145 (2013.01); H01L 2224/73207 (2013.01); H01L 2224/73215 (2013.01); H01L 2224/73217 (2013.01); H01L 2224/73265 (2013.01); H01L 2224/82031 (2013.01); H01L 2224/82039 (2013.01); H01L 2224/82047 (2013.01); H01L 2224/83005 (2013.01); H01L 2224/83192 (2013.01); H01L 2224/852 (2013.01); H01L 2224/92144 (2013.01); H01L 2224/92147 (2013.01); H01L 2225/0651 (2013.01); H01L 2225/06506 (2013.01); H01L 2225/06548 (2013.01); H01L 2225/06562 (2013.01); H01L 2225/06596 (2013.01); H01L 2225/1035 (2013.01); H01L 2225/1052 (2013.01); H01L 2225/1076 (2013.01); H01L 2225/1082 (2013.01); H01L 2924/00014 (2013.01); H01L 2924/0665 (2013.01); H01L 2924/12042 (2013.01); H01L 2924/1431 (2013.01); H01L 2924/1434 (2013.01); H01L 2924/15311 (2013.01); H01L 2924/186 (2013.01); H01L 2924/18162 (2013.01)

(58) Field of Classification Search
CPC . H01L 23/3185; H01L 23/5389; H01L 24/06; H01L 24/19; H01L 24/20; H01L 24/43; H01L 24/49; H01L 24/13; H01L 24/16; H01L 25/18; H01L 25/105; H01L 25/0657; H01L 25/50; H01L 25/117
USPC ........................................................ 257/774
See application file for complete search history.

(56) References Cited

U.S. PATENT DOCUMENTS

| | | | |
|---|---|---|---|
| 5,502,289 | A | 3/1996 | Takiar et al. |
| 5,998,864 | A | 12/1999 | Khandros et al. |
| 6,100,594 | A | 8/2000 | Fukui et al. |
| 6,885,106 | B1 | 4/2005 | Damberg et al. |
| 7,391,121 | B2 | 6/2008 | Otremba |
| 8,026,589 | B1* | 9/2011 | Kim ..................... H01L 21/568 |
| | | | 257/686 |
| 8,487,421 | B2 | 7/2013 | Sato et al. |
| 8,723,327 | B2 | 5/2014 | Caskey et al. |
| 9,165,911 | B2 | 10/2015 | Caskey et al. |
| 9,583,475 | B2* | 2/2017 | Caskey .................. H01L 24/06 |
| 2006/0202317 | A1 | 9/2006 | Barakat et al. |
| 2006/0290005 | A1 | 12/2006 | Thomas et al. |
| 2007/0035015 | A1 | 2/2007 | Hsu |
| 2007/0164404 | A1 | 7/2007 | Han |
| 2007/0252256 | A1 | 11/2007 | Lim et al. |
| 2009/0001529 | A1 | 1/2009 | Lee et al. |
| 2009/0045524 | A1 | 2/2009 | Mohammed et al. |
| 2009/0134528 | A1 | 5/2009 | Lee et al. |
| 2010/0047970 | A1 | 2/2010 | Eichelberger et al. |
| 2010/0072634 | A1* | 3/2010 | Ha ........................ H01L 25/105 |
| | | | 257/787 |
| 2011/0147911 | A1* | 6/2011 | Kohl ................... H01L 21/6835 |
| | | | 257/686 |
| 2013/0032944 | A1 | 2/2013 | Sato et al. |

FOREIGN PATENT DOCUMENTS

| | | |
|---|---|---|
| JP | 2005353837 A | 12/2005 |
| WO | 2004/034433 A2 | 4/2004 |

\* cited by examiner

MICROELECTRONIC PACKAGE WITH STACKED MICROELECTRONIC UNITS AND METHOD FOR MANUFACTURE THEREOF

CROSS-REFERENCE TO RELATED APPLICATIONS

The present application is a continuation of U.S. patent application Ser. No. 14/883,977, filed on Oct. 15, 2015 now U.S. Pat. No. 9,583,475 which is a continuation of U.S. patent application Ser. No. 14/243,994, filed Apr. 3, 2014 now U.S. Pat. No. 9,165,911. U.S. patent application Ser. No. 14/243,994 is a divisional of U.S. patent application Ser. No. 13/277,330, filed on Oct. 20, 2011 now U.S. Pat. No. 8,723,327, the disclosure of which is incorporated herein by reference.

BACKGROUND

The subject matter of the present application relates to a microelectronic package including stacked microelectronic units, and to methods of fabricating the package.

Semiconductor chips are flat bodies with contacts disposed on a front surface that are connected to internal electrical circuitry of the chip itself. The chips are typically packaged to form a microelectronic package having terminals that are electrically connected to the package's contacts. The terminals of the package may then be connected to an external microelectronic component, such as a circuit panel.

It is often desirable to package microelectronic packages in a "stack" arrangement, i.e., where plural microelectronic packages, each including at least one semiconductor chip, are placed one on top of another, to save space. In a stacked chip package structure or Package-on-Package ("PoP"), the chips of the respective packages can be mounted to occupy a surface area that is less than the total surface area of all the chips. The reduced area of the chips of the PoP can result in very efficient utilization of area on a printed circuit board ("PCB") to which the chips of the PoP can eventually be attached.

Typically, microelectronic packages included in a PoP have a size large enough to permit testing of the chips of the individual packages at chip contacts thereof, before the packages are joined in a stacked arrangement to form the PoP. In addition, in some PoPs, conductive structures electrically interconnect chip contacts of the chips of the respective packages with each other and such conductive structure may have a length that causes high parasitics between the packages, which is undesirable.

Further improvements are, therefore, desirable in the art of producing a microelectronic package including stacked microelectronic units, each of the units including a microelectronic element such as a semiconductor chip, that can be connected to a microelectronic component external to the microelectronic package.

SUMMARY

In accordance with one embodiment of the disclosure, a microelectronic package may include a first microelectronic unit including a semiconductor chip having first chip contacts, an encapsulant contacting an edge of the semiconductor chip, and first unit contacts exposed at a surface of the encapsulant and electrically connected with the first chip contacts. The package may include a second microelectronic unit including a semiconductor chip having second chip contacts at a surface thereof, and an encapsulant contacting an edge of the semiconductor chip of the second microelectronic unit and having a surface extending away from the edge, where the surfaces of the semiconductor chip and the encapsulant of the second microelectronic unit define a face of the second microelectronic unit. The package may also include bond wires electrically connected with the first unit contacts. The package may further include package terminals at the face of the second microelectronic unit electrically connected with (i) the first unit contacts through the bond wires and (ii) the second chip contacts through metallized vias and traces formed in contact with the second chip contacts.

In another embodiment of the disclosure, a method of fabricating a microelectronic package may include stacking a first microelectronic unit onto a second microelectronic unit. The first microelectronic unit may include a semiconductor chip having first chip contacts, an encapsulant contacting an edge of the semiconductor chip, and first unit contacts exposed at a surface of the encapsulant and electrically connected with the first chip contacts. The second microelectronic unit may include a semiconductor chip having second chip contacts at a surface thereof, and an encapsulant contacting an edge of the semiconductor chip of the second microelectronic unit and having a surface extending away from such edge, where the surfaces of the semiconductor chip and the encapsulant of the second microelectronic unit define a face of the second microelectronic unit. The method may further include forming bond wires electrically connecting the first unit contacts with package terminals at the face of the second microelectronic unit, where the package terminals are electrically connected with the second chip contacts through metallized vias and traces formed in contact with the second chip contacts.

DETAILED DESCRIPTION

A microelectronic package 10 including stacked microelectronic units 12 and 14, each of the microelectronic units including a microelectronic element, may be fabricated in accordance with an embodiment of the disclosure, as shown in FIGS. 1-11. Each of the microelectronic elements may be a semiconductor chip, a wafer or the like. The chips may embody a plurality of active devices (e.g., transistors, diodes, etc.), a plurality of passive devices (e.g., resistors, capacitors, inductors, etc.), or both active devices and passive devices. Typically, at least one chip embodies active devices or both active and passive devices. Each chip may be same type as the other chips in the microelectronic unit, or the chips may be of different types.

In a particular embodiment, one or more of the microelectronic units, such as the microelectronic unit 14, in the package 10 may include chips configured to have a predominant function as a logic chip, e.g., a programmable general or special purpose processor, a microcontroller, a field programmable gate array ("FPGA") device, an application specific integrated circuit ("ASIC"), a digital signal processor, among others. In such embodiment, one or more of the microelectronic units, such as the microelectronic unit 12, in the package 10 may include chips to have a predominant function other than as a logic chip. For example, the unit 14 with one or more logic chips may be combined with one or more units 12 each including one or more storage array chips having predominant memory function. Such memory storage array chip may include a volatile memory storage area, e.g., dynamic random access memory ("DRAM"), static random access memory ("SRAM"), a nonvolatile memory storage array such as flash memory or magnetic random access memory ("MRAM"), or a combination of volatile and nonvolatile storage arrays. In a particular embodiment, one or more of the microelectronic units of the package 10 may include chips which combine logic function and substantial other function, e.g., substantial memory function, on the same chip.

Figure 1:
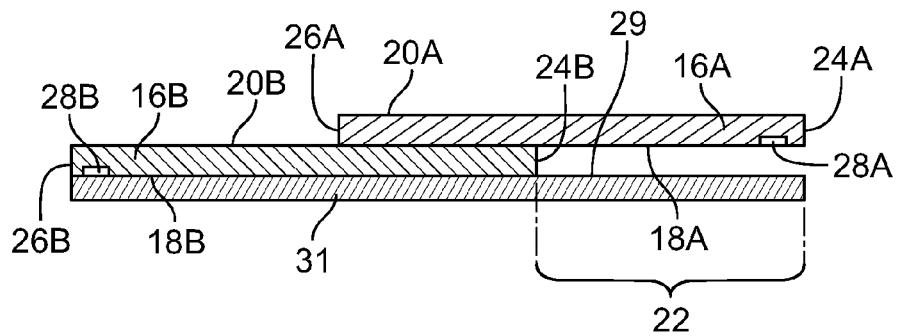
FIGS. 1-2 are diagrammatic sectional views illustrating stages in a method of fabricating a microelectronic unit including vertically stacked microelectronic elements, in accordance with one embodiment of the disclosure.
Figure 2:
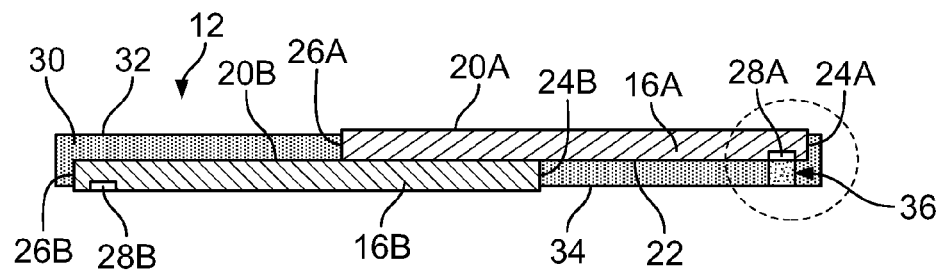

Referring to FIGS. 1-2, the microelectronic unit 12 may include vertically stacked chips 16A and 16B. Each of the chips 16 may have a front surface 18 and a rear surface 20 opposite the front surface 18. The microelectronic unit 12 may be formed with the front surface of one chip facing the rear surface of another chip, and the unit 12 may include more than two chips 16 arranged in a vertical stack. The chips 16 may be attached at their facing surfaces by a layer of adhesive (not shown), and a bottom chip in a stack of chips, such as the chip 16B in the stack including the chips 16A and 16B, may be attached to a surface 29 of a carrier plate 31 also by a layer of adhesive (not shown). The carrier plate 31 may be formed from dielectric material or glass. The adhesive layer may include a die attach adhesive, and be selected for properties of compliancy, thermally conductivity, impermeability to moisture or other contaminant, or a combination of such properties. The adhesive layer, for example, may be a flowable adhesive or tacky (partially cured) adhesive applied to overlie the front or back surfaces of the chips 16, after which chips are attached to the adhesive layer, such as using a pick-and-place tool. Alternatively, the adhesive layer may be deposited as a liquid onto a peelable backing or attached as a partially cured adhesive layer to a peelable backing, after which the chip 16 is attached to the adhesive layer. After removing the peelable backing, the adhesive layer can then be aligned and joined with another chip or the carrier plate 31.

As used in this disclosure, terms such as "upwardly," "downwardly," "vertically" and "horizontally" should be understood as referring to the frame of reference of the element specified and need not conform to the normal gravitational frame of reference. Also, for ease of reference, directions are stated in this disclosure with reference to a "front" surface of the microelectronic unit 12 which is stacked over the microelectronic unit 14 in the microelectronic package 10, such as the surface 18B of the chip 16B as shown in FIG. 1. Generally, directions referred to as "upward" or "rising from" shall refer to the direction orthogonal and away from the front surface of the microelectronic unit 12. Directions referred to as "downward" shall refer to the directions orthogonal to the front surface of the microelectronic unit 12 and opposite the upward direction. A "vertical" direction shall refer to a direction orthogonal to a front surface of the unit 12. The term "above" a reference point shall refer to a point upward of the reference point, and the term "below" a reference point shall refer to a point downward of the reference point. The "top" of any individual element shall refer to the point or points of that element which extend furthest in the upward direction, and the term "bottom" of any element shall refer to the point or points of that element which extend furthest in the downward direction.

In the microelectronic unit 12, the chip 16B may overlie the front surface 18A of the chip 16A, except for a surface portion 22 of the front surface 18A that extends beyond an edge 24B of the chip 16B to an edge 24A of the chip 16A. Edges 26 of the respective chips 16 opposing the edges 24 may or may not be vertically aligned. In one embodiment, the chips 16A and 16B may be configured and stacked such that portions 22 of the front surface 18A of the chip 16A extend respectively beyond the edges 24B and 26B of the chip 16B.

Element or chip contacts 28 electrically connected to circuitry or other conductive elements (not shown) within the chips 16 may be exposed at the portion 22 of the front surfaces 18A of the chip 16A, and at the front surface 18B of the chip 16B of the stacked chips.

As used in this disclosure, an electrically conductive feature can be considered "exposed at" a surface, such as at a surface of a dielectric layer that forms a top surface of a semiconductor chip, if the metallic feature is accessible to a contact or bonding material applied to such surface. Thus, a metallic feature which projects from the surface of the dielectric or which is flush with the surface of the dielectric is exposed at such surface; whereas a recessed conductive feature disposed in or aligned with a hole in the dielectric extending to the surface of the dielectric is also exposed at such surface.

The contacts 28, such as on a semiconductor chip, may include aluminum or copper, and have an exposed front surface with submicron dimensions. The front surface of the contact 28 may be covered with a metal or other electrically conductive material that protects the contact 28 from damage during subsequent processing, such as may occur during lasing of dielectric material overlying the front surface of the chip as described below, while providing that the contact may be electrically connected to other electrically conductive material or elements of the package through the conductive material covering the contact. See U.S. application Ser. No. 13/195,187 filed Aug. 1, 2011, incorporated by reference herein.

Referring to FIG. 2, in one stage of fabrication of the microelectronic unit 12, a layer of encapsulant 30 may be formed over the uncovered portion 22 of the surface 18A extending away from the edge 26A of the chip 16B, the edges 24 and 26 of the chips 16A and 16B and uncovered portions of the rear surface 20B of the chip 16B. The encapsulant, which protects the encapsulated components from the external environment, may include dielectric material or resin. In one embodiment, the encapsulant may be formed by a molding process that forms a planar top surface 32 of the encapsulant 30 that extends from and is coplanar with the rear surface 20A of the chip 16A. In addition, the encapsulant may form a planar rear surface 34 that extends from and is coplanar with the front surface 18B of the chip 16B. The carrier plate 31 may be removed, such as by sanding, etching or like techniques, following formation of the encapsulant, to obtain the microelectronic unit 12 with the stacked chips 16 having exposed surfaces covered by the encapsulant.

In one embodiment in which the encapsulant 30 is formed covering the contacts 28A of the chip 16A, a further stage of fabrication may include forming a hole 36 extending from the rear surface 34 through the encapsulant 30 towards the surface portion 22 of the front surface of the chip 16A. Conductive material covering the contact 28A at the portion 22 of the front surface 18A of the chip 12A is exposed within the hole 36.

Figure 3A:
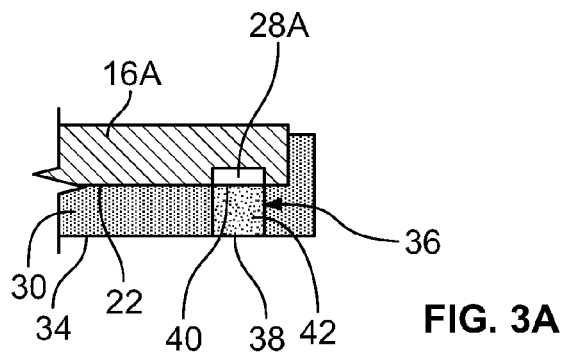
FIG. 3A is a diagrammatic sectional view of a portion a microelectronic unit including vertically stacked microelectronic elements, in accordance with one embodiment of the disclosure.
Figure 3B:
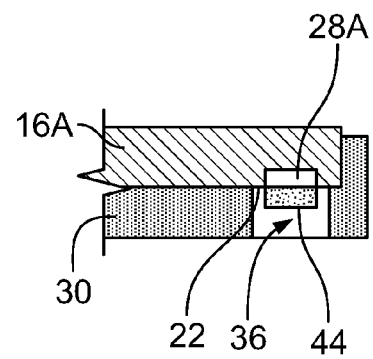
FIG. 3B is a diagrammatic sectional view of a portion a microelectronic unit including vertically stacked microelectronic elements, in accordance with another embodiment of the disclosure.
Figure 4:
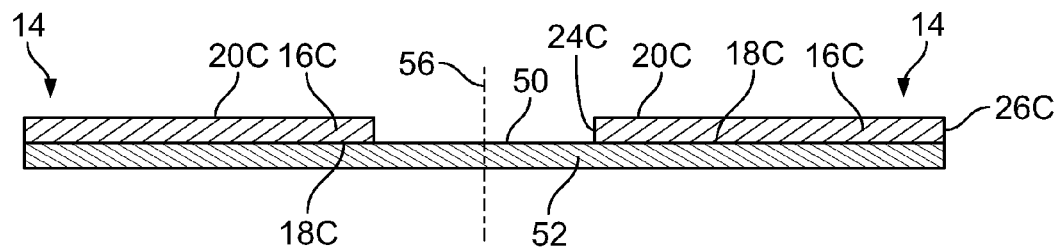
FIGS. 4-8 are diagrammatic sectional views illustrating stages in a method of fabricating a microelectronic unit with package terminals, in accordance with one embodiment of the disclosure.

The hole 36 may extend along vertical or generally vertical axes away from the chip. Referring to FIG. 3A, the hole 36 may be substantially cone-shaped or cylindrically-shaped having a substantially circularly-shaped top end 38 at the rear surface 34 and a substantially circularly-shaped bottom end 40 adjacent the contact 28A of the chip 16A. In another embodiment, the holes 36 may have an average diameter or width of about 25 microns. The difference between the diameter or width of the top end of the hole and the diameter or width of the bottom end may be about 5-10 microns. In some examples, the width of the bottom end of a hole can be smaller than the width at the top end; in another example, the bottom end width of the hole can be the same as the top end width.

In a further embodiment, the hole 36 may be in the form of a slot extending generally parallel to the front surface of a chip of the microelectronic unit 12.

In one embodiment, the hole 36 may be formed in the encapsulant by ablating, such as using a laser, punching, or etching of the encapsulant.

In another embodiment, the encapsulant 30 can be pre-fabricated to have the shape of the edges of the chips 16A, 16B, and the uncovered portions of the front surface of the chip 16A and the rear surface of the chip 16B, and also include a pre-formed hole patterned to match the exposed element contact 28A of the chip 16A. The encapsulant 30, in a softened state, may then be attached, e.g., pressed into position over the stacked chips, so that the hole is vertically aligned with the contact 28A. In one embodiment, the encapsulant in such case may be partially cured, e.g., a "B-stage" material, when attached to the stacked chips.

In a further stage of fabrication, referring to FIG. 3A, a microelectronic unit contact may be formed as a metallized via 42 extending from the rear surface 34, through the hole 36, towards the contact 28A. For example, the via 42 may extend from the rear surface 34 to a bump or post (not shown) covering the contact 28A. The via 42 may include an etchable conductive material, which is desirably a metal, such as copper, a copper-based alloy, aluminum, nickel and gold.

In one embodiment, the via 42 may be formed by deposition, for example, electrolytic or electroless metal plating, deposition of conductive material or a conductive matrix material, or by printing of a conductive paste selectively, using a stencil, into the hole to form the conductive via. In a further embodiment, a conductive seed layer (not shown) may be formed in the hole 36, before the conductive via 42 is formed.

In an alternative embodiment, the encapsulant 30 may be molded over uncovered portions of the front and rear surfaces of the chips 16A and 16B, respectively, and the edges of the chips 16, by a molding process where a structural element of a mold or another element, such as a pin, is vertically aligned with the contact 28A and forms the hole 36 during the molding process. Following formation of the encapsulant, referring to FIG. 3B, conductive material may be deposited into the hole 36 to form a conductive pad 44 at the surface portion 22, which may serve as a unit contact of the microelectronic unit 12 electrically connected to the chip contact 28A.

The various fabrication steps described above desirably may be conducted on a plurality of stacks of chips that are arranged, such as on a carrier plate, to form microelectronic units 12, and provide that individual ones of the units 12 can be obtained by severing of the encapsulant between the units at dicing lanes in the encapsulant, as suitable, before or after removal of the carrier plate. The microelectronic units 12 desirably may be constructed without requiring a package substrate in the completed microelectronic unit for supporting the at least one chip.

Referring to FIGS. 4-8, to form the microelectronic unit 14, semiconductor chips 16C may be attached at their front surfaces 18C by a layer of adhesive (not shown) to a surface 50 of a carrier plate 52. The carrier plate 52 and the adhesive may be formed from similar materials as described above for formation of the microelectronic unit 12.

Figure 5:
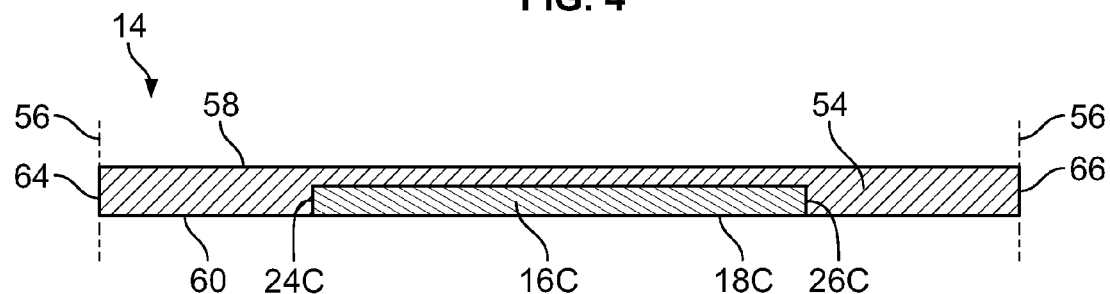

Referring to FIG. 5, a layer of encapsulant 54 may be formed over the rear surfaces 20C and the edges 24C and 26C of the chips 16C. The encapsulant 54 may include materials and be formed by molding, similarly as described above for the microelectronic unit 12, and then the carrier plate 52 may be removed. Individual microelectronic units 14, each including a chip 16C and having opposing edges 64 and 66, may then be formed by severing, e.g., such as by sawing or scribing of the encapsulant, along dicing lanes 56. In an alternative embodiment, the severing may be performed to obtain the individual packages before the carrier plate 52 is removed.

In one embodiment, the encapsulant 54 may be formed by a molding process that forms a planar top surface 58 of the encapsulant 54 extending between the edges 64 and 66, and a planar rear surface 60 that is coplanar with the front surface 18C of the chip 16C and extends between the edge 26C of the chip 16C and the edge 66 and between the edge 24C of the chip 16C and the edge 64.

Figure 6:
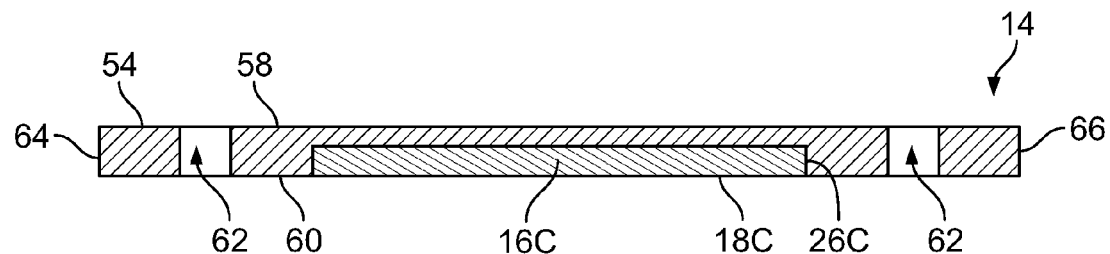

Referring to FIG. 6, holes 62 may be formed through the encapsulant 54 extending through the entire thickness thereof from the rear surface 60 to the top surface 58. The holes 62 are at predetermined positions along the surfaces 58 and 60 to permit conductive elements to pass therethrough and electrically connect contacts of the microelectronic unit 14 to microelectronic unit contacts of another microelectronic unit, such as the microelectronic unit 12, that is stacked on the microelectronic unit 14 to form the package 10, as described in detail below. The holes 62 may be in the form of cylindrically shaped slots about 400 microns-1 mm in diameter. In one embodiment, the holes 62 may include a hole between the edge 26C and the edge 66, and a hole between the edge 24C and the edge 64. In another embodiment, the holes 62 may be configured as slots extending generally horizontally in the microelectronic unit 14. The holes 62 may be formed using processes similar to those described above for forming the hole 36.

Figure 7:
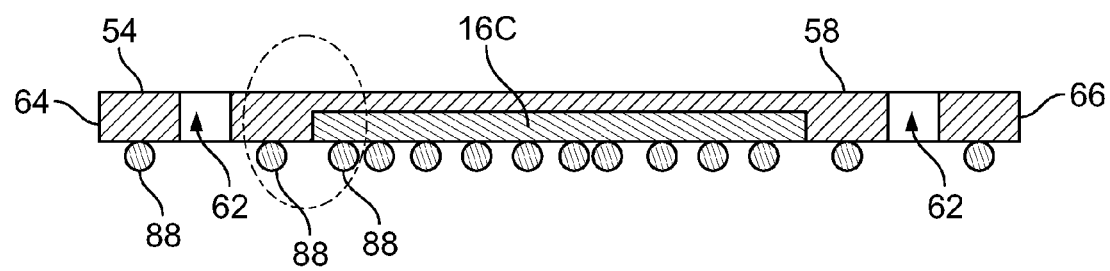
Figure 8:
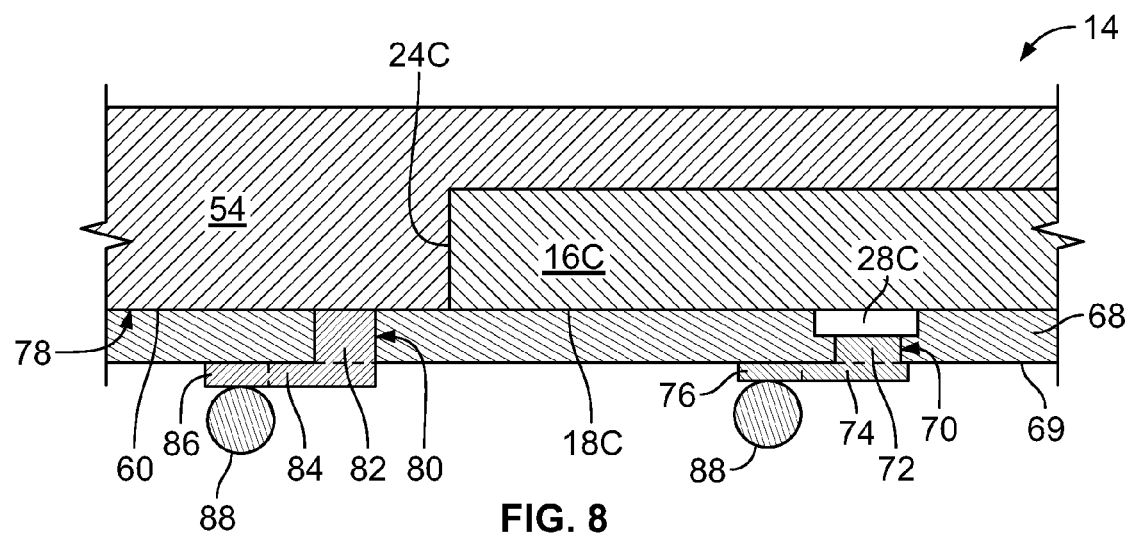

Referring to FIG. 7, and FIG. 8 which illustrates an enlarged view of a portion of the unit 14 including a contact 28C of the chip 16C exposed at the front surface 18C, a layer of dielectric material 68 may be formed over the front surface 18C of the chip 16C, over the rear surface 60 of the encapsulant 54 extending away from the front surface 18C to the holes 62 and also over the rear surface 60 extending from the holes 62 to the edges 64 and 66. A hole 70 may then be formed extending through the dielectric layer 68 towards the contact 28C, to expose conductive material (not shown) covering the contact 28C. Electrically conductive portions may then be formed at the front surface 18C including an electrically conductive via 72 extending from rear surface 69 of the dielectric layer 68, through the hole 70 to the conductive material covering the contact 28C, a conductive trace 74 extending away from the via 72 along the surface 69, and a terminal 76 at the surface 69 electrically connected, and desirably extending from, the trace 74. The terminal 76 is at or exposed at a rear surface 78 of the microelectronic unit 14, and electrically connected to the contact 28C through the trace 74 and the via 70.

In other embodiments, a series of depositions may be performed on the encapsulated assembly to build up a conductive structure which includes the metallized vias and one, two or more layers of electrically conductive traces and layers of dielectric material.

In addition, a hole 80 may be formed extending through the dielectric layer 68 to the rear surface 60 of the encapsulant 54 of the unit 14. Although not shown in the drawings, the hole 80 may extend parallel to and along a length of the surface 60 to another electrical element of the unit 14, such as a positive or negative ground terminal of a power supply (not shown). Electrically conductive portions may then be formed at the surface 78 of the unit 14 including an electrically conductive via 82 extending from the rear surface 69 of the dielectric layer 68, through the hole 80 to the rear surface 60 of the encapsulant 54, a conductive trace 84 extending away from the via 82 along the surface 69, and a terminal 86 at the surface 69 electrically connected, and desirably extending from, the trace 84. In one embodiment, the conductive material of the via 82 may extend along the rear surface 60 to connect to external connectors that constitute positive and negative terminals of a power supply (not shown).

The conductive portions forming the traces, vias and terminals at the rear surface 60 of the encapsulant of the unit 14 may include the same material used to form the unit contacts of the microelectronic unit 12 as described above, and be formed by photolithographic patterning or like processes. The traces may be formed by any suitable metal deposition technique, which may include sputtering, electroless or electrolytic plating, or printing or stenciling of an electrically conductive paste or conductive matrix material, for example.

A solder resist layer (not shown) may overlie uncovered portions of the rear surface 69 of the dielectric layer 68 and be patterned to cover the traces 74 and 84, thereby leaving the terminals 76 and 86 exposed at the surface 69.

Further, joining units, which may include masses 88 of electrically conductive material, such as a bond metal, solder, conductive paste, a conductive matrix material or the like, may be formed on exposed portions of the outer surfaces of the conductive portions serving as the terminals 74 and 84, following formation of the solder resist layer. Hence, some of the masses 88 may be electrically interconnected through a terminal 76, a conductive trace 74 and a via 72 to a contact 28C of the chip 16C. In addition, some of the masses 88 may be electrically interconnected with other electronic circuitry, for example, included in or associated with the unit 14, through a terminal 86, a trace 84 and a via 82. The masses 88 may include a bond metal such as solder, gold, tin or indium. Following formation of the masses, the solder resist layer may be removed.

The microelectronic unit 14, similar to the microelectronic unit 12, may be constructed without requiring a package substrate in the completed microelectronic unit for supporting the least one chip therein.

The units 12 and 14 formed as described above, thus, may constitute testable units, each of which may undergo testing to confirm desired electrical functionality and operability of the chips contained therein. For example, the chip 16A of the unit 12 may undergo functional testing by interconnection with the unit contacts, and the chip 16B may undergo function testing by interconnection with the exposed contacts 28B. In addition, the terminals of the microelectronic unit 14 are suitable for functional testing of the chip 16C. Thus, the chips in each microelectronic units 12 and 14 can be functionally tested prior to assembling the units in a stacked arrangement, optionally with other microelectronic units, to form a common package such as the package 10, as described below.

Figure 9:
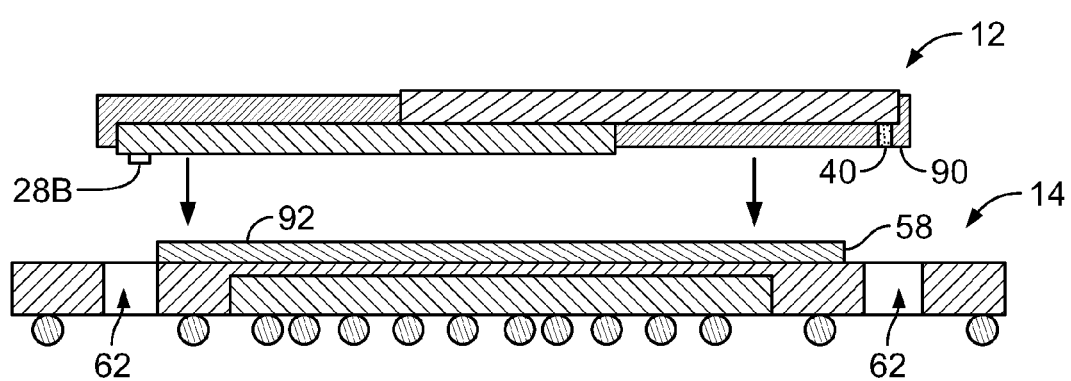
FIGS. 9-11 are diagrammatic sectional views illustrating stages in a method of fabricating a microelectronic package having stacked microelectronic units formed using the methods of FIGS. 1-3 and FIGS. 4-8, in accordance with one embodiment of the disclosure.
Figure 10:
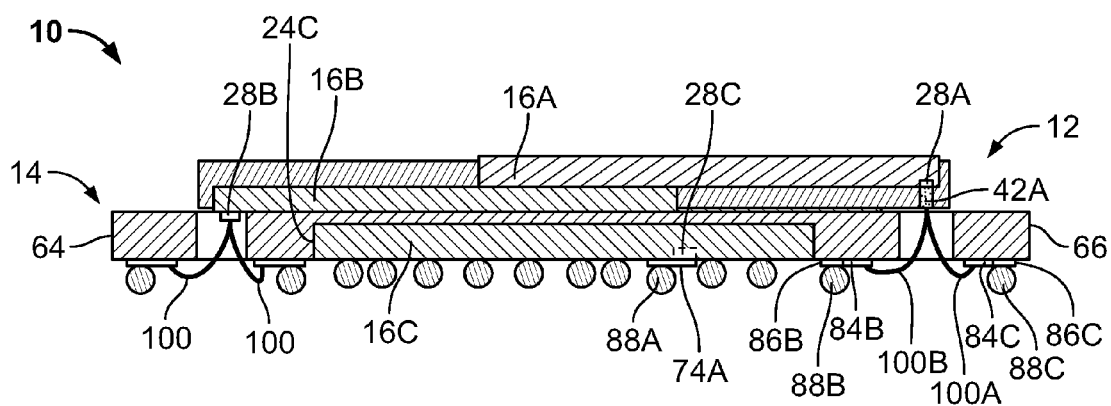
Figure 11:
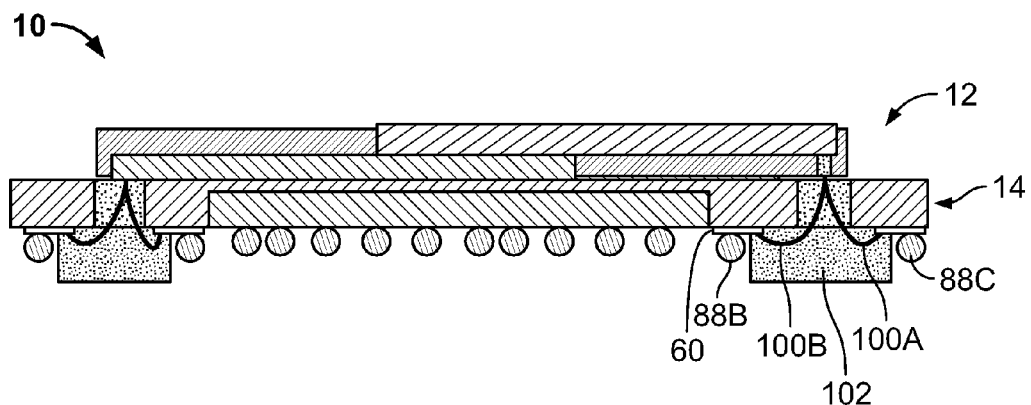

Referring to FIGS. 9-11, the microelectronic unit 12, desirably following testing thereof, may be attached to the microelectronic unit 14, also desirably following testing thereof, in a vertically stacked arrangement to form the package 10. The unit 12 may be attached at a rear surface 90 thereof, which is formed from the rear surfaces 34 and 18B, to portions of the top surface 58 of the encapsulant 54 of the unit 14 by a layer of adhesive 92. The adhesive 92 may be similar to the adhesive used to attach the chips of the unit 12 to each other, as described above. The units 12 and 14 are attached to each other with the holes 62 of the unit 14 vertically aligned with the unit contacts of the unit 12, such as the via 42, and the exposed chip contacts 28B.

Figure 12:
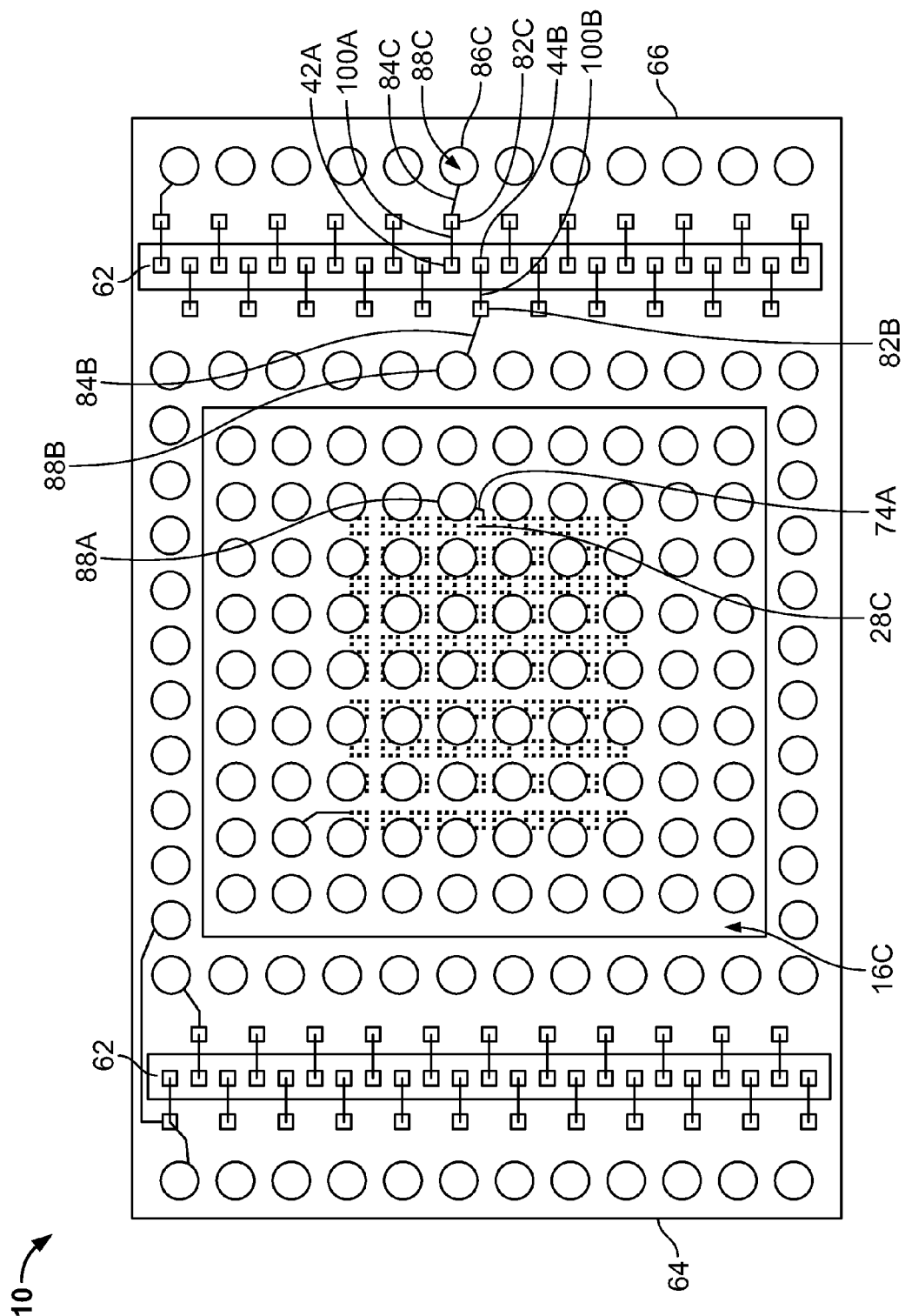
FIG. 12 is a bottom, plan view of the package of FIG. 11.

Referring to FIG. 10, the package 10 formed from the stacked units 12 and 14 may have bond wires 100 formed to connect to exposed portions of the traces 84 at one end, and at the other end to connect to the unit contacts or the chip contacts of the chips of the microelectronic unit 12. For example, further referring to FIG. 12 which is a bottom plan view of the package 10 with electrical connections between conductive elements illustrated schematically, a bond wire 100A may connect the trace 84C, which is electrically connected to the terminal 86C and the mass 88C, with a via 42A electrically connected with a contact 28A of the chip 16A of the unit 12. In addition, a bond wire 100B may connect the trace 84C, which is electrically connected to the terminal 86B and the mass 88B, with a microelectronic unit contact such as a pad (not shown) electrically connected with a different contact 28A of the chip 16A of the unit 12. Further, as discussed above with respect to formation of the unit 14, a contact 28C of the chip 16C may be electrically connected with the mass 88A through a conductive via 72A (not shown in FIG. 12), a trace 74A and a terminal 76A (also not shown in FIG. 12). In one embodiment, the terminals 86 with the associated traces, vias and masses 88 electrically connected with one another, which are positioned between the hole 62 and an adjacent edge 64 or 66 of the microelectronic unit 14, may constitute power and ground terminals to which the bond wires 100 are electrically connected, whereas the terminals 86 with associated traces, vias and masses 88 electrically connected with one another, which are between the hole 62 and the adjacent edges 24 or 26 of the chip of the microelectronic unit 14, provide for data exchange with the chips of the microelectronic unit 12 via the bond wires 100 electrically connected thereto.

In one embodiment, the bond wires 100 may be applied by heating an end of a wire exposed at an end of a capillary, the wire typically of gold, copper or copper alloy, to soften the end such that it forms a ball bond to the unit contacts, such as the via 42, and the trace 84 when pressed thereto, forming a base (not shown).

Alternatively, bond wires can be formed by wedge bonding. Wedge bonding is formed by heating a portion of the wire adjacent the end thereof and dragging it along the unit contacts and the trace at the rear surface of the unit 14 with pressure applied thereto. An aluminum bond wire can be formed this way. Such a process is described further in U.S. Pat. No. 7,391,121, the disclosure of which is hereby incorporated by reference herein in its entirety.

Referring to FIG. 11, an encapsulant 102 may be formed over uncovered surface portions of the rear surface 60 of the encapsulant 54 adjacent the holes 62 and in the holes 62 to encapsulate the bond wire 100. The encapsulant 102 may include epoxy material.

Figure 13:
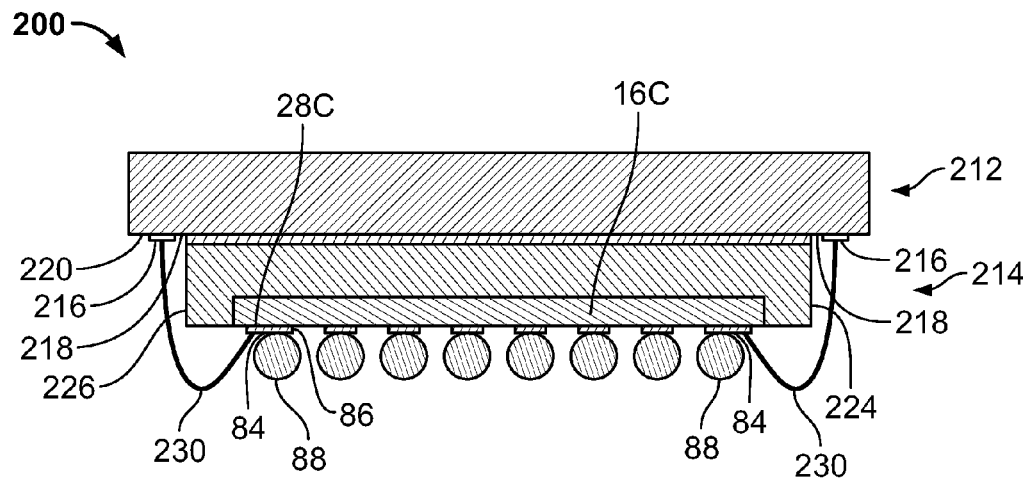
FIG. 13 is a diagrammatic sectional view of a microelectronic package, in accordance with another embodiment of the disclosure.

In another embodiment, referring to FIG. 13, a microelectronic package 200 may include a microelectronic unit 214 having a similar construction as the unit 14 and a microelectronic unit 212 having a similar construction as the unit 12, where the unit 212 is vertically stacked on top of the unit 214. In the package 200, the unit 212 has chip contacts 216 exposed on portions 218 of rear surface 220 of the unit 212 that extend away from opposing edges 224 and 226 of the unit 214, such that the unit 214 does not include holes extending therethrough and through which bond wires extend. Bond wires 230 extend from conductive material (not shown) covering the contacts 216 of the unit 212, around the edges 226 and 224, to traces 84, and the traces 84 electrically connect terminals 86 to chip contacts 28C of a semiconductor chip 16C within the unit 214, similarly as in the package 10 discussed above.

Figure 14:
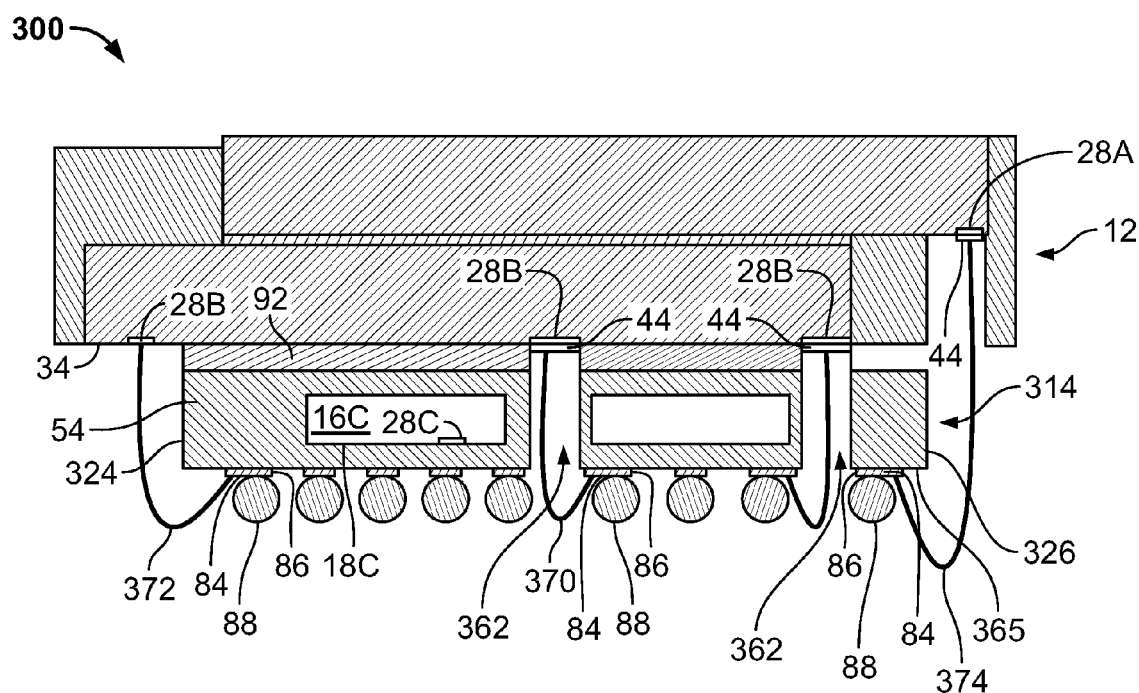
FIG. 14 is a diagrammatic sectional view of a microelectronic package, in accordance with another embodiment of the disclosure.

In another embodiment, referring to FIG. 14, a microelectronic package 300 may include a microelectronic unit 12, as described above, vertically stacked on a microelectronic unit 314. The unit 314 has a similar construction as the microelectronic unit 14 as described above, except that the rear surface of the encapsulant 54 forms a rear surface 365 of the unit 314 and encapsulant material extends from the front surface 18C of the chips 16, at which the chip contacts 28C are disposed, to the rear surface 365 of the unit 314. Further in this embodiment, holes 362 extend from the rear surface 365, through the thickness of the unit 314, to the surface 34 of the unit 12, vertically aligned with contacts 28B of the chips 16B of the overlying unit 12. Bond wires 370 extend from unit contacts 44 of the unit 12, through the holes 362, to traces 84 at the rear surface 365 of the unit 314. In addition, bond wires 372 extend from contacts 28B, around the edge 324 of the unit 314, to the traces 84 on the rear surface of the unit 314 to electrically the terminals 86 with the chip contacts 28B. Further, bond wires 374 extend from the unit contacts 44, which are electrically connected to the contacts 28A, around the edge 326 of the unit 314, to connect the traces 84 on the rear surface of the unit 314, and thus electrically connect the terminals 86 with the contacts 28A.

Figure 15:
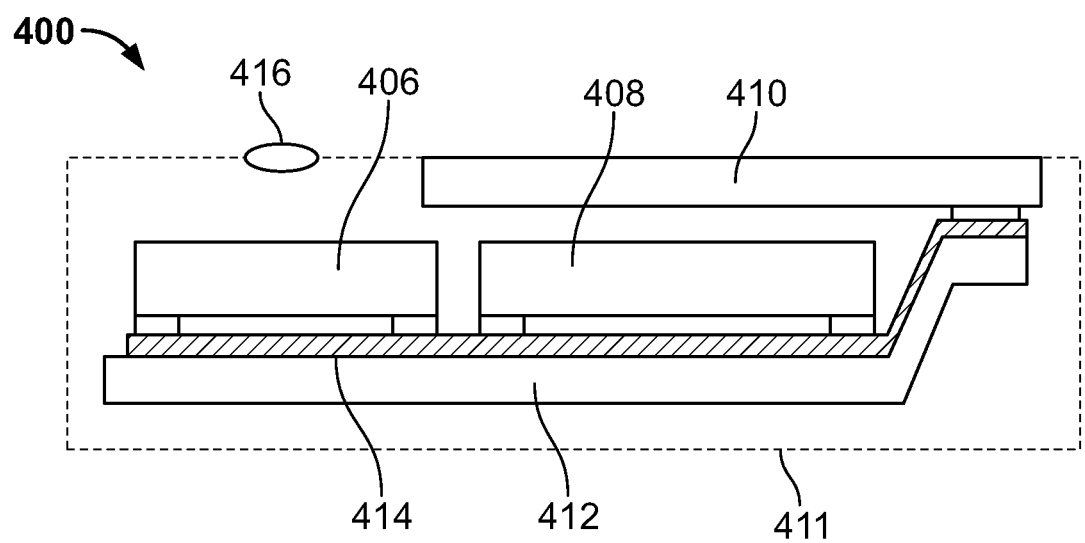
FIG. 15 is a schematic depiction of a system according to one embodiment of the disclosure.

The microelectronic packages described above can be utilized in construction of diverse electronic systems, as shown in FIG. 15. For example, a system 400 in accordance with a further embodiment of the disclosure includes a microelectronic package 406 as described above in conjunction with other electronic components 408 and 410. In the example depicted, component 408 is a semiconductor chip whereas component 410 is a display screen, but any other components can be used. Of course, although only two additional components are depicted in FIG. 15 for clarity of illustration, the system may include any number of such components. The microelectronic package or assembly 406 may be any of the packages or assemblies described above. In a further variant, any number of such microelectronic packages or assemblies may be used. Microelectronic package or assembly 406 and components 408 and 410 are mounted in a common housing 411, schematically depicted in broken lines, and are electrically interconnected with one another as necessary to form the desired circuit. In the exemplary system shown, the system includes a circuit panel 412 such as a flexible printed circuit board, and the circuit panel includes numerous conductors 414, of which only one is depicted in FIG. 15, interconnecting the components with one another. However, this is merely exemplary; any suitable structure for making electrical connections can be used. The housing 411 is depicted as a portable housing of the type usable, for example, in a cellular telephone or personal digital assistant, and screen 410 is exposed at the surface of the housing. Where structure 406 includes a light sensitive element such as an imaging chip, a lens 416 or other optical device also may be provided for routing light to the structure. Again, the simplified system shown in FIG. 15 is merely exemplary; other systems, including systems commonly regarded as fixed structures, such as desktop computers, routers and the like can be made using the structures discussed above.

Accordingly, embodiments of the disclosure provide ways of assembling testable microelectronic units in a common package having a set of common package terminals for interconnection to an external component such as a circuit panel, e.g., circuit board or flexible circuit panel. Each microelectronic unit includes at least one semiconductor chip, and unit contacts exposed at a surface of a first microelectronic unit of the microelectronic units are electrically connected with chip contacts of the at least one chip of the first unit and with the package terminals, which are at a face of a second microelectronic unit of the stacked first and second units. Each microelectronic unit can be constructed without requiring a package substrate in the completed microelectronic unit for supporting the at least one chip. The unit contacts can be displaced from the chip contacts of the semiconductor chip of the first unit in at least one direction along an exposed surface of the first microelectronic unit. The microelectronic units of the package may have features similar to those of a wafer-level chip-scale package ("WLCSP") or fan-out wafer-level package ("FO-WLP"), in which unit contacts such as wire-bondable pads are formed by depositing electrically conductive material onto an encapsulated assembly having a least one semiconductor chip therein. For example, the microelectronic units may be a part of a reconstituted wafer or a circuit panel.

The unit contacts are suitable for functional testing of the at least one semiconductor chip in each first microelectronic unit, and the terminals are suitable for functional testing of the at least one semiconductor chip in each second microelectronic unit, so that the chips in each of the first and second microelectronic units can be functionally tested prior to further assembling one or more of the first microelectronic units together with one or more of the second microelectronic units in a common package.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A microelectronic package comprising:
a first microelectronic unit including: a first semiconductor chip having first chip contacts, and first unit contacts positioned at a surface of the first microelectronic unit and electrically coupled with the first chip contacts;
a second microelectronic unit including: a second semiconductor chip having a front surface and an edge extending away from the front surface, and second chip contacts at the front surface,
wherein the first and second microelectronic units are stacked without a substrate, such that one or more of the first unit contacts is positioned on a portion of the first microelectronic unit that extends beyond an edge of the second microelectronic unit; and
package terminals at a surface of the second microelectronic unit electrically coupled with (i) the one or more of the first unit contacts through first electrically conductive structure, and with (ii) the second chip contacts through second electrically conductive structure coupled with the second chip contacts.

2. The microelectronic package as claimed in claim 1, wherein the first electrically conductive structure includes bond wires.

3. The microelectronic package as claimed in claim 1, wherein the first microelectronic unit is configured to predominantly provide memory storage array function.

4. The microelectronic package as claimed in claim 3, wherein the second microelectronic unit is configured to predominantly provide logic function.

5. The microelectronic package as claimed in claim 1, wherein the first microelectronic unit further comprises a third semiconductor chip at least partially overlying the first semiconductor chip, the third semiconductor chip having third chip contacts positioned at a surface of the third semiconductor chip.

6. The microelectronic package as claimed in claim 5, wherein at least one of the third chip contacts of third semiconductor chip is coupled to a second unit contact at the surface of the third semiconductor chip.

7. The microelectronic package as claimed in claim 5, wherein at least some of the third chip contacts of the third semiconductor chip are disposed beyond an edge of the first semiconductor chip.

8. The microelectronic package as claimed in claim 5, wherein the first chip contacts and the third chip contacts are disposed adjacent edges of the first and third semiconductor chips, respectively.

9. The microelectronic package as claimed in claim 2, wherein at least some of the bond wires extend about an edge of the second microelectronic unit.

10. The microelectronic package as claimed in claim 2, wherein at least some of the bond wires extend through a through opening in an encapsulant contacting an edge of the second semiconductor chip of the second microelectronic unit.

11. The microelectronic package as claimed in claim 10, wherein at least some of the package terminals are disposed between the through opening and an edge of the second microelectronic unit.

12. The microelectronic package as claimed in claim 11, wherein the at least some of the package terminals include at least one of power terminals or ground terminals.

13. The microelectronic package as claimed in claim 1, wherein the first microelectronic unit is laterally offset from the second microelectronic unit.

14. The microelectronic package as claimed in claim 1, wherein the first microelectronic unit is wider than the second microelectronic unit.

15. The microelectronic package as claimed in claim 1, wherein at least one of the first or second microelectronic units is functionally testable in a state uncombined with the other of the first or second microelectronic units.

16. The microelectronic package as claimed in claim 1, wherein each of the first or second microelectronic units is functionally testable in a state uncombined with the other of the first or second microelectronic units.

17. A microelectronic package comprising:
a first microelectronic unit including a first semiconductor chip having first chip contacts, the first microelectronic unit having first unit contacts positioned at a surface of the first microelectronic unit, the first unit contacts electrically coupled with the first chip contacts;
a second microelectronic unit including a second semiconductor chip having second chip contacts, the surface of the second semiconductor chip at least partially defining a face of the second microelectronic unit,
the first and second microelectronic units stacked without a substrate, such that one or more of the first unit contacts is positioned on a portion of the first microelectronic unit that extends beyond an edge of the second microelectronic unit; and
package terminals at the face of the second microelectronic unit electrically coupled with (i) the first unit contacts through first electrically conductive structure including bond wires, the bond wires extending above the face of the second microelectronic unit and laterally relative to the package terminals, and with (ii) the second chip contacts through second electrically conductive structure coupled with the second chip contacts, wherein at least some of the bond wires extend through a through the face of the second microelectronic unit.

18. The microelectronic package as claimed in claim 17, wherein at least one of the first or second microelectronic units is functionally testable in a state of the at least one microelectronic unit uncombined with any the other of the first and second microelectronic units.

19. The microelectronic package as claimed in claim 18, wherein the first microelectronic unit is laterally offset from the second microelectronic unit.

20. The microelectronic package as claimed in claim 19, wherein the first microelectronic unit is wider than the second microelectronic unit.

* * * * *